(12) United States Patent
Oh et al.

(10) Patent No.: US 9,209,208 B2
(45) Date of Patent: Dec. 8, 2015

(54) DISPLAY DEVICE AND MANUFACTURING METHOD THEREOF

(71) Applicant: Samsung Display Co., Ltd., Yongin, Gyeonggi-Do (KR)

(72) Inventors: Dong Youb Oh, Seoul (KR); Hee-Keun Lee, Suwon-si (KR)

(73) Assignee: SAMSUNG DISPLAY CO., LTD. (KR)

( * ) Notice: Subject to any disclaimer, the term of this patent is extended or adjusted under 35 U.S.C. 154(b) by 0 days.

(21) Appl. No.: 14/465,582

(22) Filed: Aug. 21, 2014

(65) Prior Publication Data

US 2015/0287744 A1  Oct. 8, 2015

(30) Foreign Application Priority Data

Apr. 2, 2014 (KR) .......... 10-2014-0039586

(51) Int. Cl.
| | |
|---|---|
| *H01L 27/12* | (2006.01) |
| *G02F 1/1337* | (2006.01) |
| *G02F 1/1341* | (2006.01) |
| *G02F 1/1335* | (2006.01) |

(52) U.S. Cl.
CPC ............ *H01L 27/127* (2013.01); *G02F 1/1337* (2013.01); *G02F 1/1341* (2013.01); *G02F 1/133512* (2013.01); *G02F 1/133514* (2013.01); *G02F 1/133711* (2013.01); *H01L 27/124* (2013.01); *H01L 27/1262* (2013.01)

(58) Field of Classification Search
CPC ..................................................... H01L 27/127
USPC .......................................................... 438/401
See application file for complete search history.

(56) References Cited

U.S. PATENT DOCUMENTS

| | | | |
|---|---|---|---|
| 6,198,217 B1 | 3/2001 | Suzuki et al. | |
| 6,469,761 B1 | 10/2002 | Drabik et al. | |
| 8,896,801 B2* | 11/2014 | Lim et al. | ........................ 349/154 |
| 2010/0014011 A1 | 1/2010 | Mottram et al. | |

FOREIGN PATENT DOCUMENTS

| | | |
|---|---|---|
| JP | 2008-033117 | 2/2008 |
| JP | 2008-242031 | 10/2008 |
| KR | 100688958 | 2/2007 |
| KR | 1020080049193 A | 6/2008 |
| KR | 1020140092662 A | 7/2014 |
| KR | 1020140133288 A | 11/2014 |
| KR | 1020140137958 A | 12/2014 |

* cited by examiner

*Primary Examiner* — Anthony Ho
(74) *Attorney, Agent, or Firm* — Innovation Counsel LLP

(57) ABSTRACT

Provided is a display device, including: an insulation substrate; a thin film transistor positioned on the insulation substrate; a pixel electrode connected with the thin film transistor; a first alignment layer positioned on the pixel electrode; a second alignment layer spaced apart from the first alignment layer by a microcavity; a common electrode positioned on the second alignment layer; a roof layer on the common electrode; a liquid crystal injection hole in the common electrode and the roof layer to extend to a part of the microcavity; a liquid crystal layer filling the microcavity; and an overcoat on the roof layer to cover the liquid crystal injection hole to seal the microcavity. Each of the first alignment layer and the second alignment layer includes a plurality of heterogeneous layers.

7 Claims, 10 Drawing Sheets

DISPLAY DEVICE AND MANUFACTURING METHOD THEREOF

CROSS-REFERENCE TO RELATED APPLICATION

This application claims priority to and the benefit of Korean Patent Application No. 10-2014-0039586 filed in the Korean Intellectual Property Office on Apr. 2, 2014, the entire contents of which are incorporated herein by reference.

BACKGROUND (a) Field

The present application relates to a display device and a manufacturing method thereof.

(b) Description of the Related Art

Display devices are required for computer monitors, televisions, mobile phones, and the like which are widely used in these days. The display devices include a cathode ray tube display device, a liquid crystal display, a plasma display device, and the like.

The liquid crystal display which is one of the most common types of flat panel displays currently in use, includes two sheets of display panels with field generating electrodes such as a pixel electrode, a common electrode, and the like, and a liquid crystal layer interposed therebetween. The liquid crystal display generates an electric field in the liquid crystal layer by applying a voltage to the field generating electrodes to determine alignment of liquid crystal molecules of the liquid crystal layer through the generated electric field and control polarization of incident light, thereby displaying images.

Two sheets of display panels configuring the liquid crystal display may include a thin film transistor array panel and an opposing display panel. In the thin film transistor array panel, a gate line transferring a gate signal and a data line transferring a data signal are formed to cross each other, and a thin film transistor connected with the gate line and the data line, a pixel electrode connected with the thin film transistor, and the like may be formed. In the opposing display panel, a light blocking member, a color filter, a common electrode, and the like may be formed. In some cases, the light blocking member, the color filter, and the common electrode may be formed on the thin film transistor array panel.

However, in a liquid crystal display in the related art, two sheets of substrates are necessarily used, and respective constituent elements are formed on the two sheets of substrates. As a result, there are problems in that the display device is heavy and thick, has high cost, and has a long processing time.

The above information disclosed in this Background section is only for enhancement of understanding of the background and therefore it may contain information that does not form the prior art that is already known in this country to a person of ordinary skill in the art.

SUMMARY

Embodiments have been made in an effort to provide a display device and a manufacturing method thereof having features of reducing a weight, a thickness, cost, and a processing time by manufacturing the display device by using one substrate.

Further, embodiments have been made in an effort to provide a display device including an alignment layer having a predetermined thickness or more, and a manufacturing method thereof.

Further, embodiments have been made in an effort to provide a display device having features of reducing a crack of an inorganic alignment layer occurring in a curved display device or a flexible display device.

An exemplary embodiment provides a display device, including: an insulation substrate; a thin film transistor; a pixel electrode; a first alignment layer; a second alignment layer; a common electrode; a roof layer; a liquid crystal injection hole; a liquid crystal layer; and an overcoat. The thin film transistor is positioned on the insulation substrate. The pixel electrode is connected with the thin film transistor. The first alignment layer is positioned on the pixel electrode. The second alignment layer is spaced apart from the first alignment layer by a microcavity. The common electrode is positioned on the second alignment layer. The roof layer is on the common electrode. The liquid crystal injection hole is in the common electrode and the roof layer to extend to a part of the microcavity. The liquid crystal layer fills the microcavity. The overcoat is on the roof layer to cover the liquid crystal injection hole to seal the microcavity. Each of the first alignment layer and the second alignment layer includes a plurality of heterogeneous layers.

The first alignment layer may include a first organic alignment layer positioned on the pixel electrode and a first inorganic alignment layer positioned on the first organic alignment layer. The second alignment layer may include a second organic alignment layer contacting the common electrode, and a second inorganic alignment layer positioned on the second organic alignment layer.

The first alignment layer and the second alignment layer may be formed by coating and drying heterogeneous aligning agents many times, each of the aligning agents may include an aligning agent solvent and an aligning agent solid, and an n-th aligning agent solvent may not dissolve an n−1-th aligning agent solid. The n may be a natural number of 2 or more.

A thickness of at least one of the first alignment layer and the second alignment layer may be about 100 Å or more.

The display device may further include a first insulating layer positioned on the thin film transistor; a second insulating layer positioned on the common electrode; and a third insulating layer on the roof layer.

At least one of the second insulating layer and the third insulating layer may be made of any one of silicon nitride, silicon oxide, and silicon oxynitride.

The display device may further include a color filter overlapping with the pixel electrode; and a light blocking member overlapping with the thin film transistor.

Another exemplary embodiment provides a manufacturing method of a display device as follows. A thin film transistor is formed on an insulation substrate. A pixel electrode is formed connected with the thin film transistor. A sacrificial layer is formed on the pixel electrode. A common electrode is formed on the sacrificial layer. A roof layer is formed on the common electrode. A liquid crystal injection hole is formed by patterning the roof layer and the common electrode to expose a part of the sacrificial layer. A microcavity is formed between the pixel electrode and the common electrode by removing the sacrificial layer. An alignment layer is formed including a plurality of layers by sequentially injecting heterogeneous aligning agents through the liquid crystal injection hole. A liquid crystal layer is formed by injecting a liquid crystal material into the microcavity through the liquid crystal injection hole. The microcavity is sealed by forming an overcoat on the roof layer.

Each of the aligning agents may include an aligning agent solvent and an aligning agent solid, and an n-th aligning agent solvent may not dissolve an n−1-th aligning agent solid. The n may be a natural number of 2 or more.

The alignment layer may include a first alignment layer positioned on the pixel electrode, and a second alignment layer spaced apart from the first alignment layer by the microcavity.

The first alignment layer may include a first organic alignment layer positioned on the pixel electrode and a first inorganic alignment layer positioned on the first organic alignment layer. The second alignment layer may include a second organic alignment layer contacting the common electrode, and a second inorganic alignment layer positioned on the second organic alignment layer.

A thickness of at least one of the first alignment layer and the second alignment layer may be about 100 Δ or more.

The manufacturing method may further include: forming a first insulating layer on the thin film transistor; and forming a second insulating layer on the common electrode.

The second insulating layer may be made of any one of silicon nitride, silicon oxide, and silicon oxynitride.

At least one of the first organic alignment layer and the second organic alignment layer may be formed through a pre-baking process, and at least one of the first inorganic alignment layer and the second inorganic alignment layer may be formed through a pre-baking process and a hard-baking process.

In the display device and the manufacturing method thereof according to the exemplary embodiments, it is possible to reduce a weight, a thickness, cost, and a processing time by manufacturing the display device by using one substrate.

Further, it is possible to provide an alignment layer having a predetermined thickness or more and suppress outgassing due to a crack of the alignment layer occurring in a flexible display device or a curved display device.

DETAILED DESCRIPTION OF THE EMBODIMENTS

Figure 1:
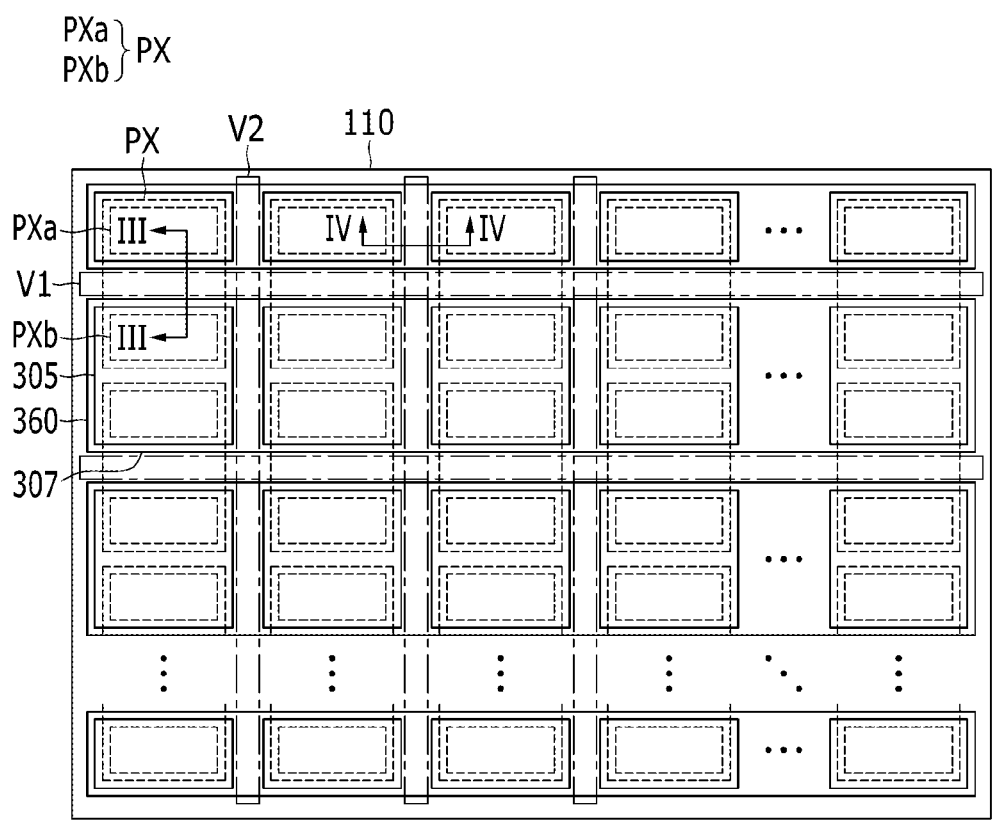
FIG. 1 is a plan view illustrating a display device according to an exemplary embodiment.

The inventive concept will be described more fully hereinafter with reference to the accompanying drawings, in which exemplary embodiments are shown. As those skilled in the art would realize, the described embodiments may be modified in various different ways, all without departing from the spirit or scope of the inventive concept.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

First, a display device according to an exemplary embodiment will be schematically described below with reference to the accompanying drawings.

FIG. 1 is a plan view illustrating a display device according to an exemplary embodiment, and for convenience, FIG. 1 illustrates only some constituent elements.

A display device according to the exemplary embodiment includes an insulation substrate 110 made of a material such as glass or plastic, and a roof layer 360 formed on the insulation substrate 110.

The insulation substrate 110 includes a plurality of pixel areas PX. The plurality of pixel areas PX is disposed in a matrix form which includes a plurality of pixel rows and a plurality of pixel columns. Each pixel area PX may include a first subpixel area PXa and a second subpixel area PXb. The first subpixel area PXa and the second subpixel area PXb may be vertically disposed.

In this case, a first valley V1 may be positioned between the first subpixel area PXa and the second subpixel area PXb in a pixel row direction, and a second valley V2 may be positioned between the plurality of pixel columns.

The roof layer 360 is formed in a pixel row direction. In this case, the roof layer 360 is removed at the first valley V1 and thus an injection hole 307 is formed so that a constituent element positioned below the roof layer 360 is exposed to the outside.

Each roof layer 360 is formed to be separated from the substrate 110 between the adjacent second valleys V2 to form a microcavity 305. Further, each roof layer 360 is formed to be attached to the substrate 110 at the second valley V2 to cover both sides of the microcavity 305.

The structure of the display device according to the exemplary embodiment described above is just exemplified, and may be variously modified. For example, a layout form of the pixel area PX, the first valleys V1, and the second valleys V2 may be modified, and the plurality of roof layers 360 may be connected to each other at the first valleys V1, and a part of each roof layer 360 is separated from the substrate 110 at the second valley V2 and thus the adjacent microcavities 305 may be connected to each other.

Next, one pixel of the display device according to the exemplary embodiment will be described below with reference to FIGS. 2 to 4, and FIG. 1.

Figure 2:
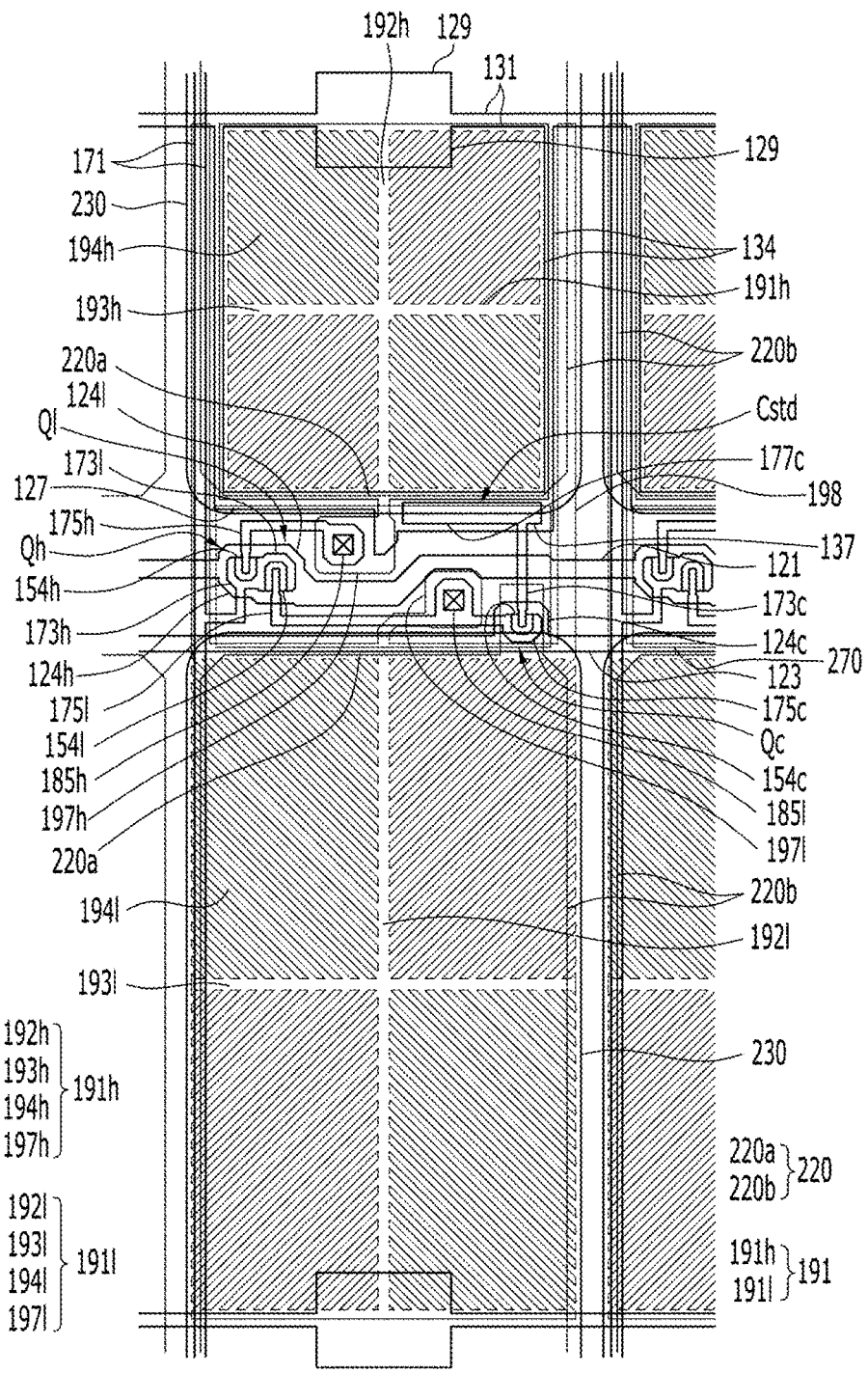
FIG. 2 is a plan view illustrating one pixel of the display device according to the exemplary embodiment.
Figure 3:
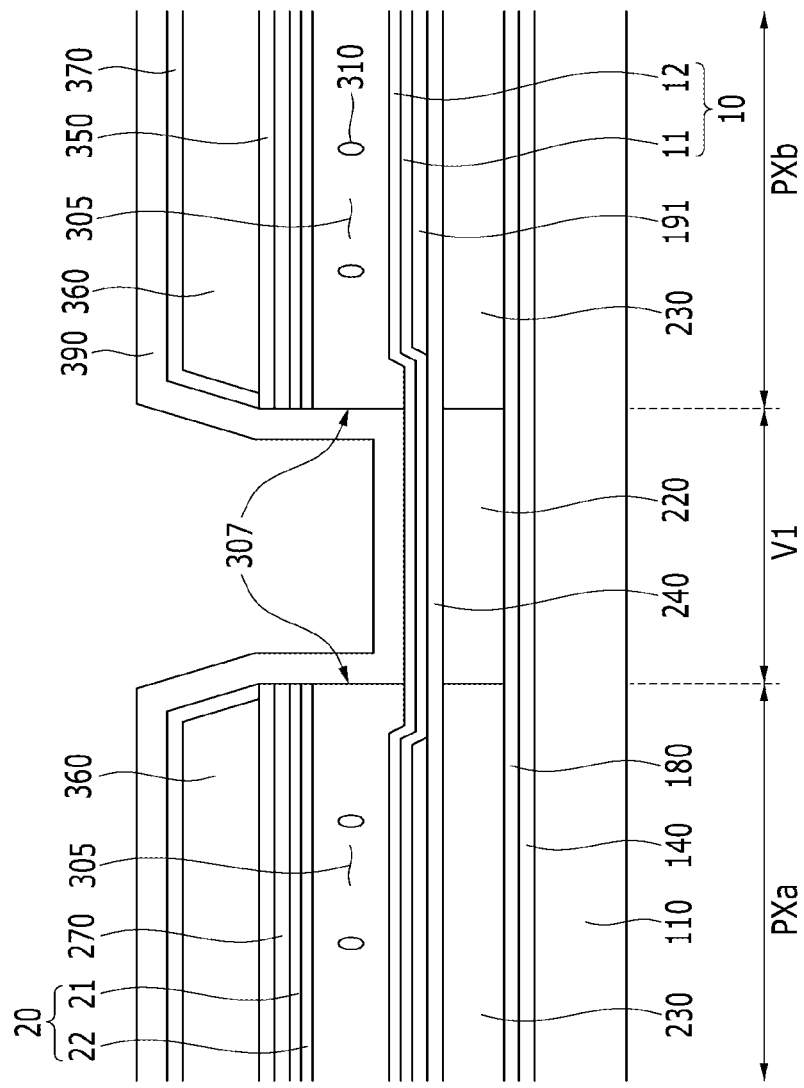
FIG. 3 is a cross-sectional view illustrating a part of the display device of FIG. 1 taken along line III-III according to the exemplary embodiment.
Figure 4:
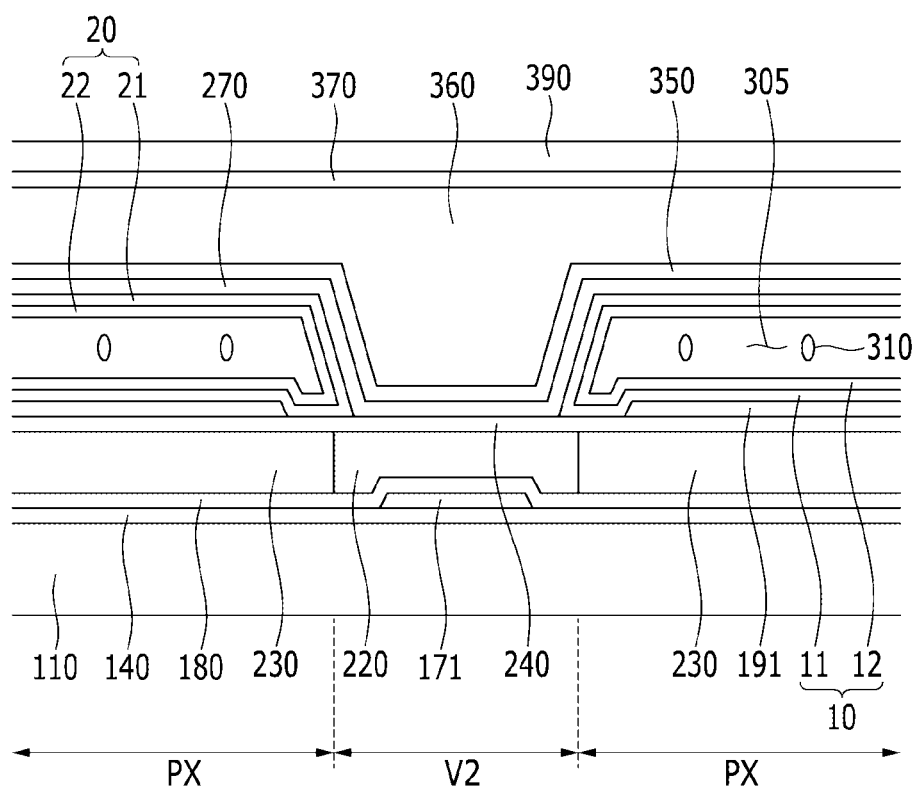
FIG. 4 is a cross-sectional view illustrating a part of the display device of FIG. 1 taken along line IV-IV according to the exemplary embodiment.

FIG. 2 is a plan view illustrating one pixel of the display device according to the exemplary embodiment, FIG. 3 is a cross-sectional view illustrating a part of the display device taken along line III-III of FIG. 1 according to the exemplary embodiment, and FIG. 4 is a cross-sectional view illustrating a part of the display device taken along line IV-IV of FIG. 1 according to the exemplary embodiment.

Referring to FIGS. 1 to 4, a plurality of gate conductors including a plurality of gate lines 121, a plurality of step-down gate lines 123, and a plurality of storage electrode lines 131 is formed on the substrate 110.

The gate line 121 and the step-down gate line 123 mainly extend in a horizontal direction to transfer gate signals. The gate conductor further includes a first gate electrode 124h and a second gate electrode 124l protruding upward and downward from the gate line 121, and further includes a third gate electrode 124c protruding upward from the step-down gate line 123. The first gate electrode 124h and the second gate electrode 124l are connected with each other to form one protrusion. In this case, the protrusion form of the first, second, and third gate electrodes 124h, 124l, and 124c may be modified.

The storage electrode line 131 mainly extends in a horizontal direction and transfers a predetermined voltage such as a common voltage Vcom. The storage electrode line 131 includes storage electrodes 129 protruding upward and downward, a pair of vertical portions 134 extending downward to be substantially vertical to the gate line 121, and a horizontal portion 127 connecting ends of the pair of vertical portions 134. The horizontal portion 127 includes a capacitor electrode 137 expanded downward.

A gate insulating layer 140 is formed on the gate conductor 121, 123, 124h, 124l, 124c, and 131. The gate insulating layer 140 may be made of an inorganic insulating material such as silicon nitride (SiNx) and silicon oxide (SiOx). Further, the gate insulating layer 140 may be formed as a single layer or a multiple layer.

A first semiconductor 154h, a second semiconductor 154l, and a third semiconductor 154c are formed on the gate insulating layer 140. The first semiconductor 154h may be positioned on the first gate electrode 124h, the second semiconductor 154l may be positioned on the second gate electrode 124l, and the third semiconductor 154c may be positioned on the third gate electrode 124c. The first semiconductor 154h and the second semiconductor 154l may be connected to each other, and the second semiconductor 154l and the third semiconductor 154c may also be connected to each other. In this case, the first semiconductor 154h may be extended to the lower portion of a data line 171. The first to third semiconductors 154h, 154l, and 154c may be made of amorphous silicon, polycrystalline silicon, metal oxide, and the like.

An ohmic contact (not illustrated) may be further formed on each of the first to third semiconductors 154h, 154l, and 154c. The ohmic contact may be made of silicide or a material such as n+ hydrogenated amorphous silicon in which n-type impurity is doped at a high concentration.

A data conductor including the data line 171, a first source electrode 173h, a second source electrode 173l, a third source electrode 173c, a first drain electrode 175h, a second drain electrode 175l, and a third drain electrode 175c is formed on the first to third semiconductors 154h, 154l, and 154c.

The data line 171 transfers a data signal and mainly extends in a vertical direction to cross the gate line 121 and the step-down gate line 123. Each data line 171 extends toward the first gate electrode 124h and the second gate electrode 124l and includes a first source electrode 173h and a second source electrode 173l which are connected with each other.

Each of the first drain electrode 175h, the second drain electrode 175l, and the third drain electrode 175c includes one wide end portion and the other rod-shaped end portion. The rod-shaped end portions of the first drain electrode 175h and the second drain electrode 175l are partially surrounded by the first source electrode 173h and the second source electrode 173l, respectively. One wide end portion of the second drain electrode 175l is again extended to form a third source electrode 173c which is bent in a 'U'-lettered shape. A wide end portion 177c of the third drain electrode 175c overlaps with the capacitor electrode 137 to form a step-down capacitor Cstd, and the rod-shaped end portion is partially surrounded by the third source electrode 173c.

The first gate electrode 124h, the first source electrode 173h, and the first drain electrode 175h form a first thin film transistor Qh together with the first semiconductor 154h. The second gate electrode 124l, the second source electrode 173l, and the second drain electrode 175l form a second thin film transistor Ql together with the second semiconductor 154l.

The third gate electrode 124c, the third source electrode 173c, and the third drain electrode 175c form the third thin film transistor Qc together with the third semiconductor 154c.

The first semiconductor 154h, the second semiconductor 154l, and the third semiconductor 154c are connected to each other to be formed in a linear shape, and may have substantially the same planar shape as the data conductor 171, 173h, 173l, 173c, 175h, 175l, and 175c and the ohmic contacts therebelow, except for channel regions between the source electrodes 173h, 173l, and 173c and the drain electrodes 175h, 175l, and 175c.

In the first semiconductor 154h, an exposed portion which is not covered by the first source electrode 173h and the first drain electrode 175h is disposed between the first source electrode 173h and the first drain electrode 175h. In the second semiconductor 154l, an exposed portion which is not covered by the second source electrode 173l and the second drain electrode 175l is disposed between the second source electrode 173l and the second drain electrode 175I. In addition, in the third semiconductor 154c, an exposed portion which is not covered by the third source electrode 173c and the third drain electrode 175c is disposed between the third source electrode 173c and the third drain electrode 175c.

A passivation layer 180 is formed on the data conductor 171, 173h, 173l, 173c, 175h, 175l, and 175c and the semiconductors 154h, 154l, and 154c exposed between the respective source electrodes 173h/173l/173c and the respective drain electrodes 175h/175l/175c. The passivation layer 180 may be made of an organic insulating material or an inorganic insulating material, and may be formed as a single layer or a multiple layer.

A color filter 230 in each pixel area PX is formed on the passivation layer 180. Each color filter 230 may display one of the primary colors such as three primary colors of red, green and blue. The color filter 230 is not limited to the three primary colors of red, green and blue, but may display cyan, magenta, yellow, white-based colors, and the like. Unlike those illustrated above, the color filter 230 may be elongated in a column direction along a space between the adjacent data lines 171.

A light blocking member 220 is formed in a region between the adjacent color filters 230. The light blocking member 220 is formed on a boundary of the pixel area PX and the thin film transistor to prevent light leakage. The color filter 230 is formed in each of the first subpixel area PXa and the second subpixel area PXb, and the light blocking member 220 may be formed between the first subpixel area PXa and the second subpixel area PXb.

The light blocking member 220 includes a horizontal light blocking member 220a which extends along the gate line 121 and the step-down gate line 123 to be expanded upward and downward, and covers regions in which the first thin film transistor Qh, the second thin film transistor Ql, and the third thin film transistor Qc are positioned, and a vertical light blocking member 220b which extends along the data line 171. That is, the horizontal light blocking member 220a may be formed at the first valley V1, and the vertical light blocking member 220b may be formed at the second valley V2. The color filter 230 and the light blocking member 220 may overlap with each other in a partial region.

A first insulating layer 240 may be further formed on the color filter 230 and the light blocking member 220. The first insulating layer 240 may be made of an inorganic insulating material such as silicon nitride (SiNx), silicon oxide (SiOx), and silicon oxynitride (SiOxNy). The first insulating layer 240 serves to protect the color filter 230 made of the organic material and the light blocking member 220, and may be omitted if necessary.

In the first insulating layer 240, the light blocking member 220, and the passivation layer 180, a plurality of first contact holes 185h and a plurality of second contact holes 185l, which expose the wide end portion of the first drain electrode 175h and the wide end portion of the second drain electrode 175l, respectively, are formed.

A pixel electrode 191 is formed on the first insulating layer 240. The pixel electrode 191 may be made of a transparent metal material such as indium tin oxide (ITO) and indium zinc oxide (IZO).

The pixel electrode 191 includes a first subpixel electrode 191h and a second subpixel electrode 191l which are separated from each other with the gate line 121 and the step-down gate line 123 therebetween, and disposed above and below the pixel area PX based on the gate line 121 and the step-down gate line 123 to be adjacent to each other in a column direction. That is, the first subpixel electrode 191h and the second subpixel electrode 191l are separated from each other with the first valley V1 therebetween, the first subpixel electrode 191h is positioned in the first subpixel area PXa, and the second subpixel electrode 191l is positioned in the second subpixel area PXb.

The first subpixel electrode 191h and the second subpixel electrode 191l are connected with the first drain electrode 175h and the second drain electrode 175l through the first contact hole 185h and the second contact hole 185l, respectively. Accordingly, when the first thin film transistor Qh and the second thin film transistor Ql are turned on, the first thin film transistor Qh and the second thin film transistor Ql receive data voltages from the first drain electrode 175h and the second drain electrode 175l.

An overall shape of each of the first subpixel electrode 191h and the second subpixel electrode 191l is a quadrangle, and the first subpixel electrode 191h and the second subpixel electrode 191l include cross stems including horizontal stems 193h and 193l and vertical stems 192h and 192l crossing the horizontal stems 193h and 193l, respectively. Further, the first subpixel electrode 191h and the second subpixel electrode 191l include a plurality of minute branches 194h and 194l, and protrusions 197h and 197l protruding downward or upward from edge sides of the subpixel electrodes 191h, 191l respectively.

The pixel electrode 191 is divided into four subregions by the horizontal stems 193h and 193l and the vertical stems 192h and 192l. The minute branches 194h and 194l obliquely extend from the horizontal stems 193h and 193l and the vertical stems 192h and 192l, and the extending direction may form an angle of approximately 45 degrees or 135 degrees with the gate line 121 or the horizontal stems 193h and 193l. Further, directions in which the minute branches 194h and 194l of the two adjacent subregions extend may be perpendicular to each other.

In the exemplary embodiment, the first subpixel electrode 191h further includes an outer stem surrounding the outside, and the second subpixel electrode 191l further includes horizontal portions positioned at an upper end and a lower end, and left and right vertical portions 198 positioned at the left and the right of the first subpixel electrode 191h. The left and right vertical portions 198 may prevent capacitive coupling, that is, coupling between the data line 171 and the first subpixel electrode 191h.

The layout form of the pixel area, the structure of the thin film transistor, and the shape of the pixel electrode described above are just exemplified, and the inventive concept is not limited thereto and may be variously modified.

The common electrode 270 is formed on the pixel electrode 191 so as to be spaced apart from the pixel electrode 191 at a predetermined distance. The microcavity 305 is formed between the pixel electrode 191 and the common electrode 270. That is, the microcavity 305 is surrounded by the pixel electrode 191 and the common electrode 270. A width and an area of the microcavity 305 may be variously modified according to a size and a resolution of the display device.

The common electrode 270 may be made of a transparent metal material such as indium tin oxide (ITO) and indium zinc oxide (IZO). A predetermined voltage may be applied to the common electrode 270, and an electric field may be generated between the pixel electrode 191 and the common electrode 270.

A first alignment layer 10 is formed on the pixel electrode 191. The first alignment layer 10 may also be formed directly on the first insulating layer 240 which is not covered by the pixel electrode 191.

The first alignment layer 10 may include a plurality of layers made of different materials. In detail, the alignment layer is formed through drying and curing after coating an aligning agent, and the first alignment layer 10 according to the exemplary embodiment is formed by using heterogeneous aligning agents, and includes a plurality of layers having different properties.

Meanwhile, each aligning agent includes an aligning agent solvent and an aligning agent solid. An n−1-th first aligning agent includes an n−1-th first aligning agent solvent and an n−1-th first aligning agent solid, and an n-th first aligning agent includes an n-th first aligning agent solvent and an n-th first aligning agent solid. In this case, n is a natural number of 2 or more.

First, the n−1-th first aligning agent is coated and cured to form the n−1-th first alignment layer. Next, the n-th first aligning agent is coated and cured to form the n-th first alignment layer, and in this case, the n-th first aligning agent solvent included in the n-th first aligning agent does not dissolve the n−1-th first aligning agent solid.

The reason is that when the n-th first aligning agent solvent may dissolve the n−1-th first aligning agent solid, the cured n−1-th first alignment layer is again dissolved. As such, when the n-th first aligning agent solvent may dissolve the n−1-th first aligning agent solid, even though the plurality of aligning agents is coated, the first alignment layer 10 having a predetermined thickness may not be formed.

According to the exemplary embodiment, the first alignment layer 10 may include a first organic alignment layer 11 and a first inorganic alignment layer 12. The first organic alignment layer 11 is positioned on the pixel electrode 191, and the first inorganic alignment layer 12 is positioned on the first organic alignment layer 11.

According to the exemplary embodiment, first, the first organic alignment layer 11 is formed by coating an organic aligning agent. In order to form the first organic alignment layer 11, only pre-baking is performed. That is, a separate hard-baking is not performed. Next, the first inorganic alignment layer 12 is formed by coating an inorganic aligning agent. The first inorganic alignment layer 12 is formed by performing the hard-baking process after the pre-baking. In this case, the inorganic alignment layer does not dissolve the alignment layer solid included in the organic alignment layer. Accordingly, the first organic alignment layer 11 and the first inorganic alignment layer 12 may be stably formed without interaction to form the first alignment layer 10 having a predetermined thickness or more. For example, the first alignment layer 10 having a thickness of about 100 Å or more may be formed.

In this specification, as an example, the organic aligning agent and the inorganic aligning agent are described, but the inventive concept is not limited thereto, and any exemplary embodiment in which the n−1-th aligning agent solid is not dissolved by the n-th aligning agent solvent is possible.

A second alignment layer 20 is formed below the common electrode 270 so as to face the first alignment layer 10.

The second alignment layer 20 may include a plurality of layers made of different materials. In detail, the second alignment layer 20 is formed by repeating a process of coating and curing heterogeneous aligning agents many times, and a plurality of layers having different properties is formed according to an aligning agent.

Meanwhile, each of the heterogeneous aligning agents includes an aligning agent solvent and an aligning agent solid. The n−1-th aligning agent includes an n−1-th aligning agent solvent and an n−1-th aligning agent solid, and the n-th aligning agent includes an n-th aligning agent solvent and an n-th aligning agent solid. In this case, n is a natural number of 2 or more.

First, an n−1-th second alignment layer is formed by coating and curing the n−1-th aligning agent. Next, the n-th second alignment layer is formed by coating and curing the n-th second aligning agent, and in this case, the n-th second aligning agent solvent included in the n-th second aligning agent does not dissolve the n−1-th second aligning agent solid. The reason is that when the n-th second aligning agent solvent may dissolve the n−1-th second aligning agent solid, the cured n−1-th second alignment layer is dissolved again. As such, in the case where the n-th second aligning agent solvent may dissolve the n−1-th second aligning agent solid, even though the plurality of second aligning agents is coated, a second alignment layer having a predetermined thickness may not be formed.

According to an exemplary embodiment, the second alignment layer 20 may include a second organic alignment layer 21 and a second inorganic alignment layer 22. The second organic alignment layer 21 is positioned on one surface of the common electrode 270, and the second inorganic alignment layer 22 is positioned on the second organic alignment layer 21.

According to the exemplary embodiment, the organic aligning agent is first coated to form the second organic alignment layer 21. Next, the inorganic aligning agent is coated to form the second inorganic alignment layer 22. In this case, the inorganic aligning agent does not dissolve an alignment layer solid included in the organic alignment layer. Accordingly, the second organic alignment layer 21 and the second inorganic alignment layer 22 are stably formed without a separate reaction to form the second alignment layer 20 having a predetermined thickness or more. For example, the second alignment layer 20 having a thickness of about 100 Å or more may be formed.

In this specification, as an example, the organic aligning agent and the inorganic aligning agent are described, but the inventive concept is not limited thereto, and any exemplary embodiment in which the n−1-th aligning agent solid is not dissolved by the n-th aligning agent solvent is possible.

The first alignment layer 10 and the second alignment layer 20 may be formed as vertical alignment layers, and the first and second alignment layers 10 and 20 may be connected to each other at an edge of the pixel area PX.

A liquid crystal layer configured by liquid crystal molecules 310 is formed in the microcavity 305 positioned between the pixel electrode 191 and the common electrode 270. The liquid crystal molecules 310 have negative dielectric anisotropy, and may stand up in a vertical direction to the substrate 110 while the electric field is not applied. That is, vertical alignment may be performed.

The first subpixel electrode 191h and the second subpixel electrode 191l to which the data voltages are applied generate an electric field together with the common electrode 270 to determine directions of the liquid crystal molecules 310 positioned in the microcavity 305 between the two electrodes 191 and 270. As such, luminance of light passing through the liquid crystal layer varies according to the directions of the liquid crystal molecules 310 which are determined above.

A second insulating layer 350 may be further formed on the common electrode 270. The second insulating layer 350 may be made of an inorganic insulating material such as silicon nitride (SiNx), silicon oxide (SiOx), and silicon oxynitride (SiOxNy), and may be omitted if necessary.

A roof layer 360 is formed on the second insulating layer 350. The roof layer 360 may be made of an organic material. The microcavity 305 is formed below the roof layer 360, and the roof layer 360 is hardened by a curing process to maintain the shape of the microcavity 305. That is, the roof layer 360 is formed to be spaced apart from the pixel electrode 191 with the microcavity 305 therebetween.

The roof layer 360 is formed in each pixel area PX along a pixel row and the second valley V2, and is not formed in the first valley V1. That is, the roof layer 360 is not formed between the first subpixel area PXa and the second subpixel area PXb. The microcavity 305 is formed below each roof layer 360 at each of the first subpixel area PXa and the second subpixel area PXb. In the second valley V2, the microcavity 305 is not formed below the roof layer 360, but formed to be attached to the substrate 110. Accordingly, a thickness of the roof layer 360 positioned at the second valley V2 may be larger than a thickness of the roof layer 360 positioned at each of the first subpixel area PXa and the second subpixel area PXb. The upper surface and both sides of the microcavity 305 are formed to be covered by the roof layer 360.

Meanwhile, the roof layers 360 are not positioned in the first valley region, but separated from each other with the first valley region therebetween. As a result, the roof layer 360 in a region adjacent to the valley region is inclined and has an inclined surface.

An injection hole 307 exposing a part of the microcavity 305 is formed in the common electrode 270, the second insulating layer 350, and the roof layer 360. The injection holes 307 may be formed to face each other at the edges of the first subpixel area PXa and the second subpixel area PXb. That is, the injection holes 307 may be formed to correspond to the lower side of the first subpixel area PXa and the upper side of the second subpixel area PXb so as to expose a side of the microcavity 305. Since the microcavity 305 is exposed by the injection hole 307, an aligning agent, a liquid crystal material, or the like may be injected into the microcavity 305 through the injection hole 307.

An overcoat 390 may be formed on a third insulating layer 370. The overcoat 390 is formed to cover the injection hole 307 exposing the part of the microcavity 305 to the outside. That is, the overcoat 390 may seal the microcavity 305 so that the liquid crystal molecules 310 formed in the microcavity 305 are not discharged outside. Since the overcoat 390 contacts the liquid crystal molecules 310, the overcoat 390 may be made of a material which does not react with the liquid crystal molecules 310. For example, the overcoat 390 may be made of parylene and the like.

The overcoat 390 may be formed by a multilayer such as a double layer and a triple layer. The double layer is configured by two layers made of different materials.

The triple layer is configured by three layers, and materials of adjacent layers are different from each other. For example, the overcoat 390 may include a layer made of an organic insulating material and a layer made of an inorganic insulating material.

Although not illustrated, polarizers may be further formed on upper and lower sides of the display device. The polarizers may be configured by a first polarizer and a second polarizer. The first polarizer may be attached onto the lower side of the substrate 110, and the second polarizer may be attached onto the overcoat 390.

In the display device according to the exemplary embodiment, an alignment layer having a predetermined thickness or more may be formed. The display device including the alignment layer having a predetermined thickness or more has a feature of providing a display device having an excellent voltage storage rate and excellent performance. Further, in the case when the display device is applied to a curved display device including an inorganic alignment layer, it is possible to prevent a crack of the alignment layer through the organic alignment layer formed therewith, and as a result, it is possible to suppress outgassing.

Next, a manufacturing method of a display device according to another exemplary embodiment will be described below with reference to FIGS. 5 to 10. Further, the manufacturing method will be described with reference to FIGS. 1 to 4 together.

FIGS. 5 to 10 are process cross-sectional views illustrating a manufacturing method of a display device according to another exemplary embodiment.

Figure 5:
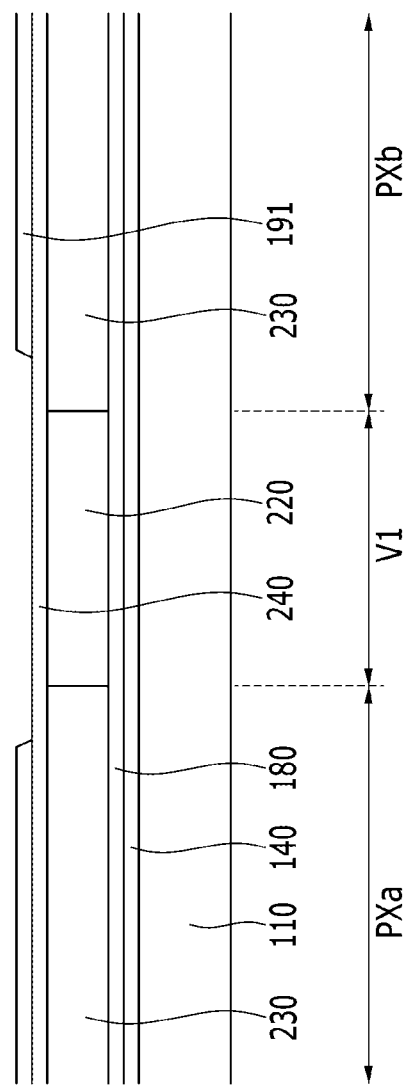
FIGS. 5, 6, 7, 8, 9, 10 are process cross-sectional views illustrating a manufacturing method of a display device according to another exemplary embodiment.

First, as illustrated in FIGS. 2, 5, a gate line 121 and a step-down gate line 123 extending in one direction are formed on an insulation substrate 110 made of glass or plastic, and a first gate electrode 124h, a second gate electrode 124l, and a third gate electrode 124c which protrude from the gate line 121 are formed.

Further, a storage electrode line 131 may be formed together so as to be spaced apart from the gate line 121, the step-down gate line 123, and the first to third gate electrodes 124h, 124l, and 124c.

Next, a gate insulating layer 140 is formed the substrate 110 including the gate line 121, the step-down gate line 123, the first to third gate electrodes 124h, 124l, and 124c, and the storage electrode line 131 by using an inorganic insulating material such as silicon oxide (SiOx) or silicon nitride (SiNx). The gate insulating layer 140 may be formed by a single layer or a multiple layer.

Next, a first semiconductor 154h, a second semiconductor 154l, and a third semiconductor 154c are formed by depositing and then patterning a semiconductor material such as amorphous silicon, polycrystalline silicon, and metal oxide on the gate insulating layer 140. The first semiconductor 154h may be positioned on the first gate electrode 124h, the second semiconductor 154l may be positioned on the second gate electrode 124l, and the third semiconductor 154c may be positioned on the third gate electrode 124c.

Next, a data line 171 extending in the other direction is formed by depositing and then patterning a metal material. The metal material may be formed by a single layer or a multiple layer.

Further, a first source electrode 173h protruding above the first gate electrode 124h from the data line 171, and a first drain electrode 175h spaced apart from the first source electrode 173h are formed together. Further, a second source electrode 173l connected with the first source electrode 173h, and a second drain electrode 175l spaced apart from the second source electrode 173l are formed together. Further, a third source electrode 173c extended from the second drain electrode 175l, and a third drain electrode 175c spaced apart from the third source electrode 173c are formed together.

The first to third semiconductors 154h, 154l, and 154c, the data line 171, the first to third source electrode 173h, 173l, and 173c, and the first to third drain electrode 175h, 175l, and 175c may be formed by sequentially depositing and then simultaneously patterning a semiconductor material and a metal material. In this case, the first semiconductor 154h may be extended to the lower portion of the data line 171.

The first/second/third gate electrodes 124h/124l/124c, the first/second/third source electrodes 173h/173l/173c, and the first/second/third drain electrodes 175h/175l/175c form first/second/third thin film transistors (TFTs) Qh/Ql/Qc together with the first/second/third semiconductors 154h/154l/154c, respectively.

Next, a passivation layer 180 is formed on the data line 171, the first to third source electrodes 173h, 173l, and 173c, the first to third drain electrodes 175h, 175l, and 175c, and the semiconductors 154h, 154l, and 154c exposed between the respective source electrodes 173h/173l/173c and the respective drain electrodes 175h/175l/175c. The passivation layer 180 may be made of an organic insulating material or an inorganic insulating material, and may be formed as a single layer or a multiple layer.

Next, a color filter 230 is formed in each pixel area PX on the passivation layer 180. The color filter 230 is formed in the first subpixel area PXa and the second subpixel area PXb, and may not be formed at the first valley V1. Further, the color filters 230 having the same color may be formed in a column direction of the plurality of pixel areas PX. In the case of forming the color filter 230 having three colors, a first colored color filter 230 may be first formed and then a second colored color filter 230 may be formed by shifting a mask. Next, the second colored color filter 230 may be formed and then a third colored color filter 230 may be formed by shifting a mask.

Next, a light blocking member 220 is formed on a boundary of each pixel area PX on the passivation layer 180 and the thin film transistor. The light blocking member 220 may be formed even at the first valley V1 positioned between the first subpixel area PXa and the second subpixel area PXb.

Hereinabove, it is described that the light blocking member 220 is formed after forming the color filters 230, but the inventive concept is not limited thereto, and the light blocking member 220 is first formed and then the color filters 230 may be formed.

Next, a first insulating layer 240 made of an inorganic insulating material such as silicon nitride (SiNx), silicon oxide (SiOx), and silicon oxynitride (SiOxNy) is formed on the color filter 230 and the light blocking member 220.

Next, a first contact hole 185h is formed by etching the passivation layer 180, the light blocking member 220, and the first insulating layer 240 so as to extend to and expose a part of the first drain electrode 175h, and a second contact hole 185l is formed so as to extend to and expose a part of the second drain electrode 175l.

Next, a first subpixel electrode 191h is formed in the first subpixel area PXa, and a second subpixel electrode 191l is formed in the second subpixel area PXb, by depositing and then patterning a transparent metal material such as indium tin oxide (ITO) and indium zinc oxide (IZO) on the first insulating layer 240. The first subpixel electrode 191h and the second subpixel electrode 191l may be separated from each other with the first valley V1 therebetween. The first subpixel electrode 191h is connected with the first drain electrode 175h through the first contact hole 185h, and the second subpixel electrode 191l is connected to the second drain electrode 175l through the second contact hole 185l.

Horizontal stems 193h and 193l, and vertical stems 192h and 192l crossing the horizontal stems 193h and 193l are formed in the first subpixel electrode 191h and the second subpixel electrode 191l, respectively. Further, a plurality of minute branches 194h and 194l, which obliquely extends from the horizontal stems 193h and 193l and the vertical stems 192h and 192l, is formed.

Figure 6:
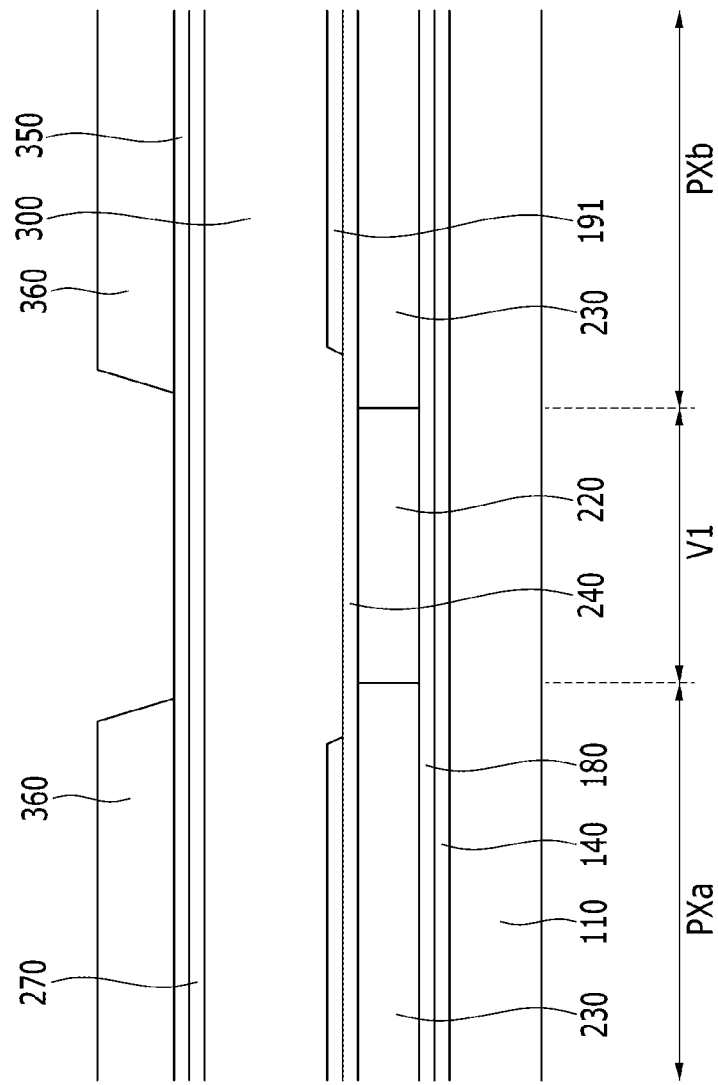

As illustrated in FIG. 6, a sacrificial layer 300 is formed by coating a photosensitive organic material on the pixel electrode 191 and performing a photolithography process.

The sacrificial layers 300 are formed to be connected to each other along the plurality of pixel columns. That is, the sacrificial layer 300 is formed to cover each pixel area PX, and formed to cover the first valley V1 positioned between the first subpixel area PXa and the second subpixel area PXb.

Next, a common electrode 270 is formed by depositing a transparent metal material such as indium tin oxide (ITO) and indium zinc oxide (IZO) on the sacrificial layer 300.

Next, a second insulating layer 350 may be formed on the common electrode 270 with an inorganic insulating material such as silicon nitride (SiNx), silicon oxide (SiOx), and silicon oxynitride (SiOxNy).

Next, the roof layer 360 is formed by coating and patterning an organic material on the second insulating layer 350. In this case, the organic material positioned at the first valley V1 may be patterned so as to be removed. As a result, the roof layers 360 may be formed to be connected to each other along a plurality of pixel rows.

Meanwhile, the roof layers 360 are not positioned in the first valley region, but separated from each other with the valley region therebetween. Accordingly, the roof layer 360 in the region adjacent with the valley region is inclined and formed to have an inclined surface.

Figure 7:
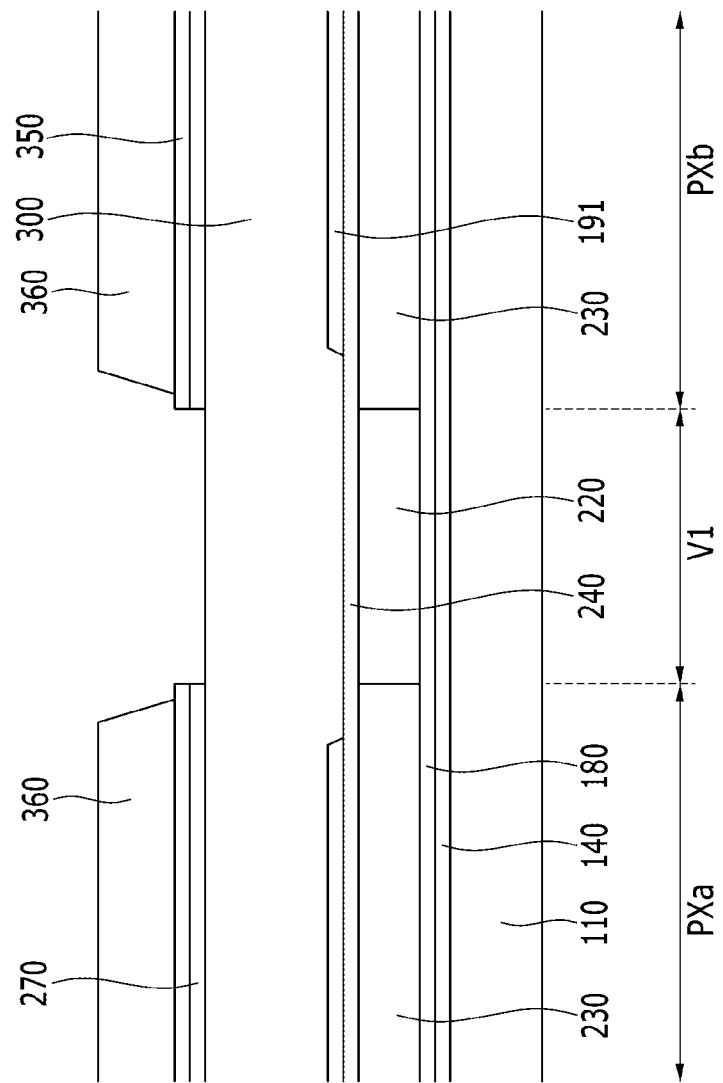

Next, as illustrated in FIG. 7, the second insulating layer 350 and the common electrode 270 are patterned by using the roof layer 360 as a mask. First, the second insulating layer 350 is dry-etched by using the roof layer 360 as a mask and then the common electrode 270 is wet-etched.

Figure 8:
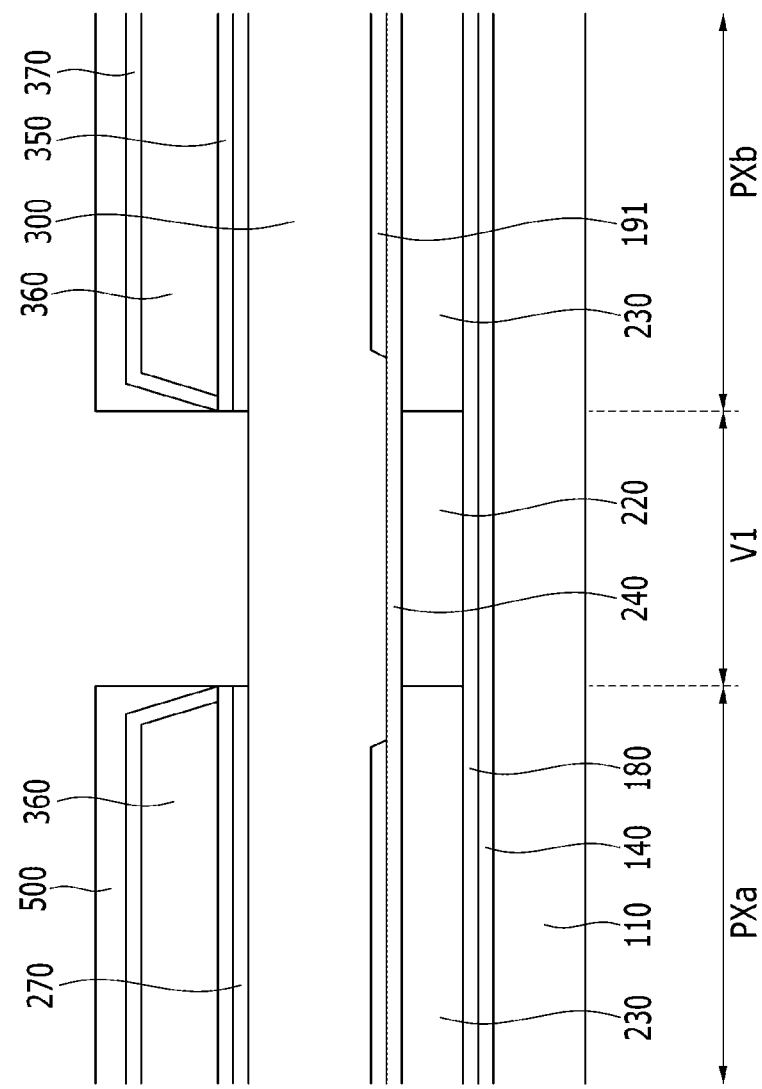

Next, as illustrated in FIG. 8, a third insulating layer 370 made of an inorganic insulating material such as silicon nitride (SiNx), silicon oxide (SiOx), and silicon oxynitride (SiOxNy) may be formed on the roof layer 360.

Next, a photoresist 500 is coated on the third insulating layer 370, and the photoresist 500 is patterned by a photolithography process. In this case, the photoresist 500 positioned at the first valley V1 may be removed. The third insulating layer 370 is etched by using the patterned photoresist 500 as a mask. That is, the third insulating layer 370 positioned at the first valley V1 is removed. The photoresist 500 is removed.

The third insulating layer 370 may be formed to cover the upper surface and the side of the roof layer 360 to protect the roof layer 360. The pattern of the third insulating layer 370 may be positioned at the outside of the pattern of the roof layer 360.

The pattern of the second insulating layer 350 may be the same as the pattern of the third insulating layer 370. Unlike this, the pattern of the second insulating layer 350 may be formed at an inside of the pattern of the roof layer 360. In this case, the third insulating layer 370 may be formed to contact the second insulating layer 350.

Hereinabove, a facility for patterning the roof layer 360 may be different from a facility for patterning the third insulating layer 370, and a difference between the patterns of the third insulating layer 370 and the roof layer 360 may be increased due to an arrangement error between the facilities. In this case, a portion where the pattern of the third insulating layer 370 is positioned at the outside of the pattern of the roof layer 360 may be sagged or broken, but since the third insulating layer 370 is not a conductive member, there is no problem such as a short circuit between the third insulating layer 370 and the pixel electrode 191

Hereinabove, the process of forming the third insulating layer 370 is described, but the inventive concept is not limited thereto, and the third insulating layer 370 may not be formed. When the third insulating layer 370 is not formed, it is possible to prevent a problem which occurs due to misalignment between the facility for patterning the roof layer 360 and the facility for patterning the third insulating layer 370.

Further, since the second insulating layer 350 and the common electrode 270 are patterned by using the roof layer 360 as a mask, the misalignment does not occur.

Figure 9:
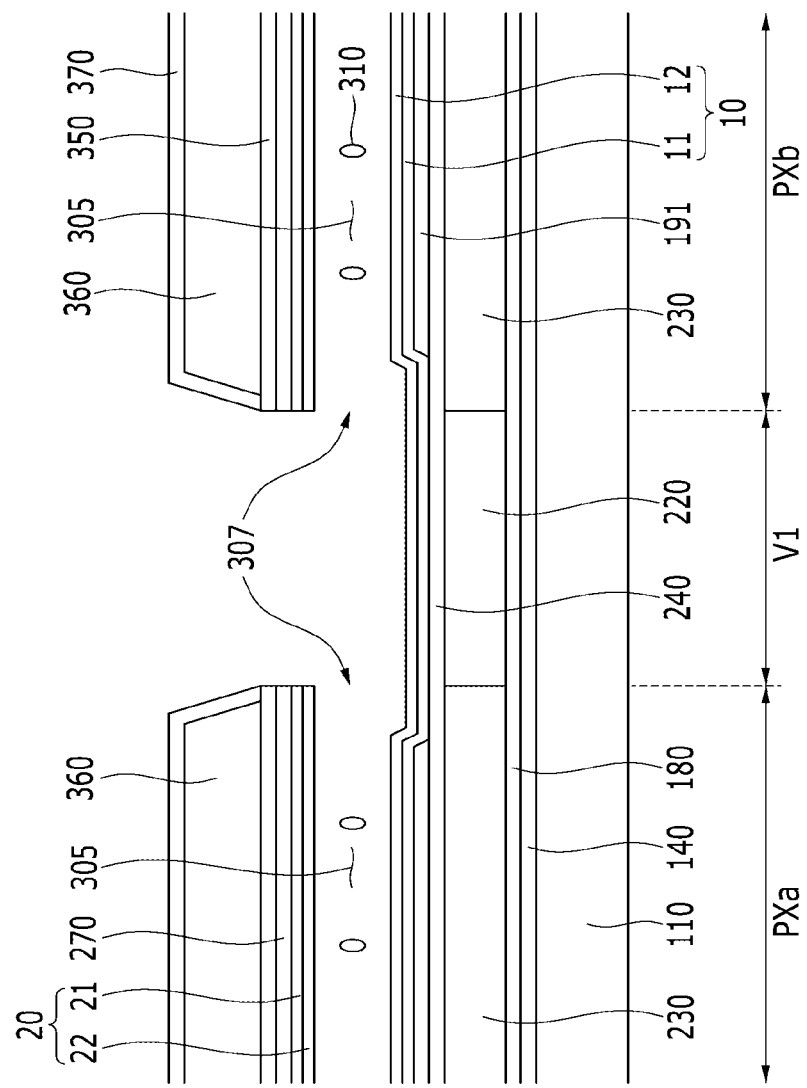

As illustrated in FIG. 9, the sacrificial layer 300 is fully removed by supplying a developer and a stripper solution on the substrate 110 where the sacrificial layer 300 is exposed, or fully removed by using an ashing process.

When the sacrificial layer 300 is removed, the microcavity 305 is generated at a site where the sacrificial layer 300 is positioned.

The pixel electrode 191 and the common electrode 270 are spaced apart from each other with the microcavity 305 therebetween, and the pixel electrode 191 and the roof layer 360 are spaced apart from each other with the microcavity 305 therebetween. The common electrode 270 and the roof layer 360 are formed to cover the upper surface and both sides of the microcavity 305.

The microcavity 305 is exposed outside through a portion where the roof layer 360, the second insulation layer 350, and the common electrode 270 are removed, which is called the injection hole 307. The injection hole 307 is formed along the first valley V1. For example, the injection holes 307 may be formed to face each other at the edges of the first subpixel area PXa and the second subpixel area PXb. That is, the injection holes 307 may correspond to the lower side of the first subpixel area PXa and the upper side of the second subpixel area PXb to expose the side of the microcavity 305. Unlike this, the injection hole 307 may also be formed along the second valley V2.

Next, the roof layer 360 is cured by applying heat to the substrate 110. This is to maintain the shape of the microcavity 305 by the roof layer 360.

Next, when an aligning agent containing an alignment material drops on the substrate 110 by a spin coating method or an inkjet method, the aligning agent is injected into the microcavity 305 through the injection hole 307. When the aligning agent is injected into the microcavity 305 and then a curing process is performed, a solution component is evaporated and the alignment material remains on the inner wall of the microcavity 305. Hereinafter, the alignment layer according to the exemplary embodiment will be described in more detail.

At least one of the first alignment layer 10 and the second alignment layer 20 may include a plurality of layers made of different materials. In detail, the alignment layer is formed through drying and curing after coating an aligning agent, and the first alignment layer 10 and the second alignment layer 20 according to the exemplary embodiment are formed by using heterogeneous aligning agents, and include a plurality of layers having different properties.

Meanwhile, each aligning agent includes an aligning agent solvent and an aligning agent solid. The n−1-th aligning agent includes an n−1-th aligning agent solvent and an n−1-th aligning agent solid, and the n-th aligning agent includes an n-th aligning agent solvent and an n-th aligning agent solid. In this case, n is a natural number of 2 or more.

First, the n−1-th aligning agent is coated and cured to form the n−1-th alignment layer. Next, the n-th aligning agent is coated and cured to form the n-th alignment layer, and in this case, the n-th aligning agent solvent included in the n-th aligning agent does not dissolve the n−1-th aligning agent solid. The reason is that when the n-th aligning agent solvent may dissolve the n−1-th aligning agent solid, the cured n−1-th alignment layer is again dissolved. As such, when the n-th aligning agent solvent may dissolve the n−1-th aligning agent solid, even though the plurality of aligning agents is coated, the first alignment layer 10 or the second alignment layer 20 having a predetermined thickness may not be formed.

According to the exemplary embodiment, first, the first organic alignment layer 11 and the second organic alignment layer 21 are formed by coating an organic aligning agent. Next, the first inorganic alignment layer 12 and the second inorganic alignment layer 22 are formed by coating an inorganic aligning agent. In this case, the inorganic alignment layer does not dissolve the alignment layer solid included in the organic alignment layer. Accordingly, the first organic alignment layer 11, the second organic alignment layer 21, the first inorganic alignment layer 12, and the second inorganic alignment layer 22 may be stably formed without interaction. As a result, the first alignment layer 10 and the second alignment layer 20 having a predetermined thickness or more are formed. For example, the first alignment layer 10 and the second alignment layer 20 having a thickness of about 100 Å or more may be formed. Such a thickness enables providing an improved voltage storage rate and an excellent display device.

In this specification, as an example, the organic aligning agent and the inorganic aligning agent are described, but the inventive concept is not limited thereto, and any exemplary embodiment in which the n−1-th aligning agent solid is not dissolved by the n-th aligning agent solvent is possible.

In summary, through the aforementioned process, the first alignment layer 10 may be formed on the pixel electrode 191, and the second alignment layer 20 may be formed below the common electrode 270. The first alignment layer 10 and the second alignment layer 20 face each other with the microcavity 305 therebetween and are connected to each other at an edge of the pixel area PX.

In this case, the first and second alignment layers 10 and 20 may be aligned in a vertical direction to the substrate 110, except for the side of the microcavity 305. In addition, a process of irradiating a UV to the first and second alignment layers 11 and 21 is performed, and as a result, the first and second alignment layers 11 and 21 may be aligned in a horizontal direction to the substrate 110.

Next, when the liquid crystal material constituted by liquid crystal molecules 310 drops on the substrate 110 by an inkjet method or a dispensing method, the liquid crystal material is injected into the microcavity 305 through the injection hole 307.

The liquid crystal material may be dropped in the injection holes 307 formed along the odd-numbered first valleys V1 and may not be dropped in the injection holes 307 formed along the even-numbered first valleys V1. On the contrary, the liquid crystal material may be dropped in the injection holes 307 formed along the even-numbered first valleys V1 and may not be dropped in the injection holes 307 formed along the odd-numbered first valleys V1.

When the liquid crystal material drops in the injection holes 307 formed along the odd-numbered first valleys V1, the liquid crystal material passes through the injection hole 307 by capillary force to be injected into the microcavity 305. In this case, the liquid crystal material is injected into the microcavity 305 by discharging air in the microcavity 305 through the injection holes 307 formed along the even-numbered first valleys V1.

Further, the liquid crystal material may drop in all of the injection holes 307. That is, the liquid crystal material may drop in all the injection holes 307 formed along the odd-numbered first valleys V1 and the injection holes 307 formed along the even-numbered first valleys V1.

As described above, when the liquid crystal material is injected into the microcavity by capillary force, the liquid crystal dropped in the injection hole contacts a part of the roof layer to remain on the roof layer. However, on the roof layer having a large thickness or a low angle according to the exemplary embodiment, the remaining liquid crystal is reduced, thereby reducing a pixel defect.

Figure 10:
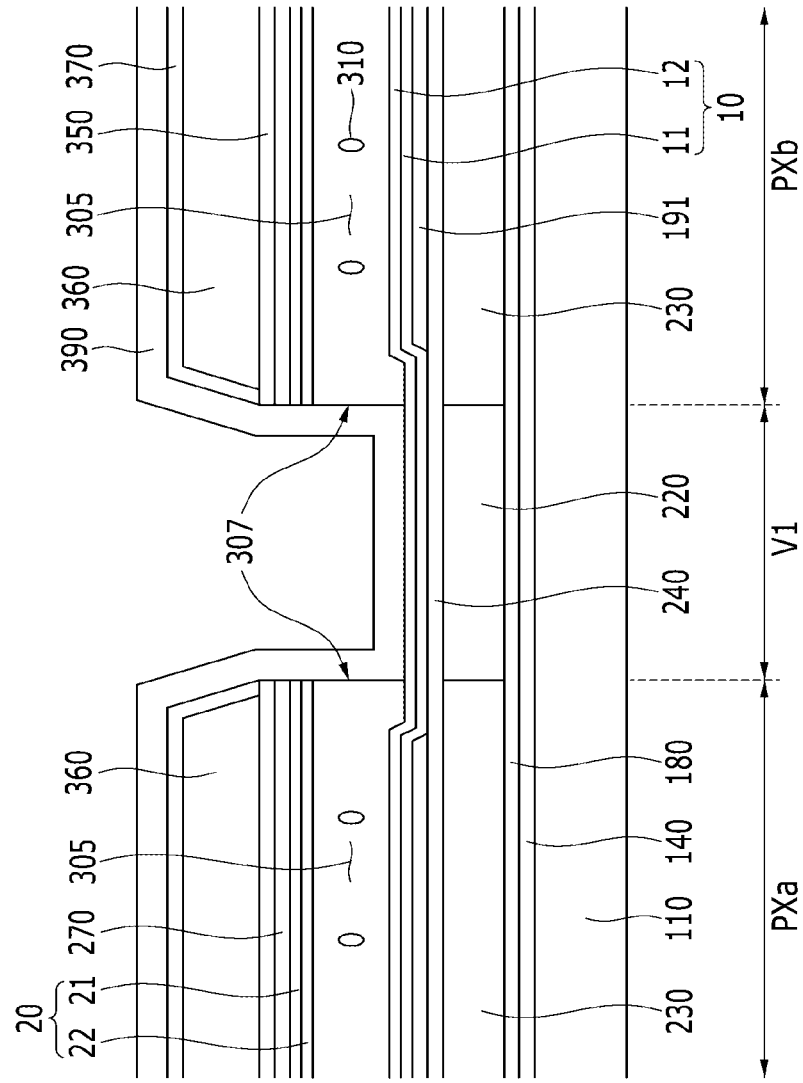

As illustrated in FIG. 10, an overcoat 390 is formed by depositing a material which does not react with the liquid crystal molecules 310 on the third insulating layer 370. The overcoat 390 is formed to cover the injection hole 307 where the microcavity 305 is exposed outside to seal the microcavity 305.

Next, although not illustrated, polarizers may be further attached onto the upper and lower surfaces of the display device. The polarizers may be configured by a first polarizer and a second polarizer. The first polarizer may be attached onto the lower surface of the substrate 110, and the second polarizer may be attached onto the overcoat 390.

In the display device according to the exemplary embodiment, an alignment layer having a predetermined thickness or more may be formed. The display device including the alignment layer having a predetermined thickness or more has a feature of providing a display device having an excellent voltage storage rate and excellent performance. Further, in the case when the display device is applied to a curved display device including an inorganic alignment layer, it is possible to prevent a crack of the alignment layer through the organic alignment layer formed therewith, and as a result, it is possible to suppress outgassing.

While the inventive concept has been described in connection with what is presently considered to be practical exemplary embodiments, it is to be understood that the inventive concept is not limited to the disclosed embodiments, but, on the contrary, is intended to cover various modifications and equivalent arrangements included within the spirit and scope of the appended claims.

DESCRIPTION OF SYMBOLS

11: First organic alignment layer
12: First inorganic alignment layer
21: Second organic alignment layer
22: Second inorganic alignment layer
110: Substrate
121: Gate line
124h: First gate electrode
124l: Second gate electrode
124c: Third gate electrode
131: Storage electrode line
140: Gate insulating layer
154h: First semiconductor 154*l*: Second semiconductor
154*c*: Third semiconductor
171: Data line
173*h*: First source electrode
173*l*: Second source electrode
173*c*: Third source electrode
175*h*: First drain electrode
175*l*: Second drain electrode
175*c*: Third drain electrode
180: Passivation layer
191: Pixel electrode
191*h*: First subpixel electrode
191*l*: Second subpixel electrode
220: Light blocking member
230: Color filter
240: First insulating layer
270: Common electrode
300: Sacrificial layer
305: Microcavity
307: Injection hole
310: Liquid crystal molecule
350: Second insulating layer
360: Roof layer
390: Overcoat

What is claimed is:

1. A display device, comprising:
an insulation substrate;
a thin film transistor positioned on the insulation substrate;
a pixel electrode connected with the thin film transistor;
a first alignment layer positioned on the pixel electrode;
a second alignment layer spaced apart from the first alignment layer by a microcavity;
a common electrode positioned on the second alignment layer;
a roof layer on the common electrode;
a liquid crystal injection hole in the common electrode and the roof layer to extend to a part of the microcavity;
a liquid crystal layer filling the microcavity; and
an overcoat on the roof layer to cover the liquid crystal injection hole to seal the microcavity,
wherein each of the first alignment layer and the second alignment layer includes a plurality of heterogeneous layers.

2. The display device of claim 1, wherein:
the first alignment layer includes
a first organic alignment layer positioned on the pixel electrode, and
a first inorganic alignment layer positioned on the first organic alignment layer, and
the second alignment layer includes
a second organic alignment layer contacting the common electrode, and
a second inorganic alignment layer positioned on the second organic alignment layer.

3. The display device of claim 1, wherein:
the first alignment layer and the second alignment layer are formed by coating and drying heterogeneous aligning agents many times,
each of the aligning agents includes an aligning agent solvent and an aligning agent solid, and
an n-th aligning agent solvent does not dissolve an n−1-th aligning agent solid:
n is a natural number of 2 or more.

4. The display device of claim 1, wherein:
a thickness of at least one of the first alignment layer and the second alignment layer is about 100 Å or more.

5. The display device of claim 1, further comprising:
a first insulating layer positioned on the thin film transistor;
a second insulating layer positioned on the common electrode; and
a third insulating layer on the roof layer.

6. The display device of claim 5, wherein:
at least one of the second insulating layer and the third insulating layer is made of any one of silicon nitride, silicon oxide, and silicon oxynitride.

7. The display device of claim 1, further comprising:
a color filter overlapping with the pixel electrode; and
a light blocking member overlapping with the thin film transistor.

* * * * *